(12) United States Patent
Schleicher et al.

(10) Patent No.: US 6,265,895 B1
(45) Date of Patent: *Jul. 24, 2001

(54) PROGRAMMABLE LOGIC DEVICE INCORPORATING A MEMORY EFFICIENT INTERCONNECTION DEVICE

(75) Inventors: James Schleicher, Sunnyvale; Michael J. Ferrazano, San Jose, both of CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/525,979

(22) Filed: Mar. 15, 2000

Related U.S. Application Data

(63) Continuation of application No. 09/016,209, filed on Jan. 30, 1998.

(51) Int. Cl.[7] ................... H03K 19/177; H03K 19/173
(52) U.S. Cl. ................................. 326/40; 326/38
(58) Field of Search .................. 326/39, 41, 44, 326/40, 38; 716/16

(56) References Cited

U.S. PATENT DOCUMENTS

| | | |
|---|---|---|
| Re. 34,363 | 8/1993 | Freeman . |
| 4,989,022 * | 1/1991 | Hwang et al. ............. 340/825.8 |
| 5,153,463 * | 10/1992 | Keichi ........................... 326/41 |
| 5,327,023 | 7/1994 | Kawana et al. . |
| 5,436,576 * | 7/1995 | Hibdon et al. ................ 326/47 |
| 5,550,782 | 8/1996 | Cliff et al. . |
| 5,689,686 * | 11/1997 | Nazarian et al. .............. 395/500 |
| 5,804,986 | 9/1998 | Jones . |
| 5,880,597 | 3/1999 | Lee . |
| 5,977,791 * | 11/1999 | Veenstra ........................ 326/40 |
| 6,034,547 * | 3/2000 | Pani et al. ...................... 326/41 |
| 6,057,707 * | 5/2000 | Schleicher et al. ........... 326/40 |
| 6,084,427 * | 7/2000 | Lee et al. ....................... 326/39 |

OTHER PUBLICATIONS

Bursky, D., "Combinatin RAM/PLD Opens New Application Options", Electronic Design, pp. 138–140, May 23, 1991.

Intel Corporation "10ns FLEXlogic FPGA with SCRAM Option", Intel® iFX780, pp. 2–24–2–46, Nov. 1993.

Nagai, Tony Kai–Kit, "An SRAM–Prograbbable Field–Reconfigurable Memory," Department of Electrical Engineering, University of Toronto, Thesis for Master of Applied Science, 1994.

* cited by examiner

Primary Examiner—Michael Tokar
Assistant Examiner—James H. Cho
(74) Attorney, Agent, or Firm—Beyer Weaver & Thomas LLP

(57) ABSTRACT

The invention relates to an integrated circuit that incorporates a memory efficient interconnection device. Typically, the integrated circuit chip is a complex programmable logic device architecture (CPLD). By using the memory efficient interconnection device, the invention is able to reduce the quantity of memory resources required to program the interconnection device while at the same time not substantially sacrificing the probability of fitting logic functions in the CPLD. The reduction in memory resources that the CPLD must provide leads to increased availability of precious die area for other components of the CPLD.

14 Claims, 13 Drawing Sheets

PROGRAMMABLE LOGIC DEVICE INCORPORATING A MEMORY EFFICIENT INTERCONNECTION DEVICE

This is a Continuation application of co-pending prior Application Ser. No. 09/016,209 filed on Jan. 30, 1998 the disclosure of which is incorporated herein by reference.

CROSS REFERENCE TO RELATED APPLICATION

This application claims benefit of priority under 35 U.S.C. 119(e) of (i) U.S. Provisional Application No. 60/050,329, filed Jun. 20, 1997 and entitled "Embedded Array Block with Split Programmable Interconnect Array and Shared Input Muxes in a Programmable Logic Device." and (ii) U.S. Provisional Application No. 60/065,329, filed Nov. 14, 1997 and entitled "Programmable Logic Device Incorporating an Interleaved Embedded Array Block Programmable Interface Array,"

BACKGROUND OF THE INVENTION

1. Field of the Invention

The present invention generally relates to programmable logic devices. More specifically, the present invention relates to interconnecting logic and memory elements included within programmable logic devices.

2. Description of the Related Art

A programmable logic device (PLD) is a programmable integrated circuit that allows the user of the circuit, using software control, to program particular logic functions the circuit will perform. Logic functions performed by small, medium, and large-scale integration integrated circuits can instead be performed by programmable logic devices. When an integrated circuit manufacturer supplies a typical programmable logic device, it is not yet capable of performing any specific function. The user, in conjunction with software supplied by the manufacturer or created by the user or an affiliated source, can program the PLD to perform particular functions required by the user's application. The PLD then can function in a larger system designed by the user just as though dedicated logic chips were employed. For the purpose of this description, it is to be understood that a programmable logic device refers to once programmable devices as well as reprogrammable devices.

Programmable logic encompasses all digital logic circuits that are configured by the end user, including PLDs, field programmable gate arrays (FPGAs) and complex programmable logic devices (CPLDs). The general architecture of the embedded array programmable logic design will be generally familiar to those knowledgeable of the FLEX10K™ logic family of devices manufactured by the Altera Corporation of San Jose, Calif. Such an architecture, for example, is described in U.S. Pat. No. 5,550,782 and Altera Data Book 1996, both of which are incorporated herein by reference. Referring initially to FIGS. 1 and 2, a CPLD 100 with an embedded array programmable logic design will be described. Although only a few logic array blocks or memory blocks are illustrated, it should be appreciated that any number may be provided in order to meet the needs of a particular system.

The CPLD 100 includes a core region 120 and a peripheral region 121. The peripheral region 121 includes a plurality of vertical bidirectional ports 160 and a plurality of horizontal ports 162. The core region 120 includes a plurality of logic array blocks (LAB) 102 and a plurality of embedded array blocks (EAB) 104. Each EAB 104 includes an array of memory elements. Each LAB 102 includes a plurality of logic elements (LE) each of which is capable of performing simple logic functions. An internal logic interconnect included within each LAB serves to interconnect each of the logic elements included therein.

As shown in FIG. 1, the plurality of LABs 102 and the plurality of EABs 104 are programmably interconnected by way of a plurality global horizontal conductors 190 and a plurality of global vertical conductors 192 to form a logic and memory array. The global horizontal conductors 190 couple to the horizontal ports 162, and the global vertical conductors 192, couple to the vertical ports 160.

For example, the horizontal bidirectional port 162-1 can be selectively coupled to a global horizontal conductor 190-1 (and all row channels included therein) so that core region 120 may communicate with external circuitry connected to the horizontal bidirectional port 162-1. Such external circuitry may, for example, include processing systems such as Pentium™ based PCs or Sun SPARCstations™. Such processing systems are capable of executing automatic place and route software such as, for example, MAX+PLUS II™ developed by the Altera Corporation of San Jose, Calif. In a procedure known in the art as fitting a logic function, such automatic place and route software is used to logically couple previously programmed logic and memory units included within core region 120. In this manner, CPLD 100 is programmed to perform the logic function as desired.

Additional details of the CPLD 100 are explained with reference to a representative portion 110 of the core region 120 illustrated in FIG. 1. The representative portion 110 has the global horizontal conductor 190-1 coupled to EAB 104-1 by way of a plurality of local vertical conductors 134 and a plurality of local horizontal conductors 136. The local vertical conductors 134 are programmably coupled to the global horizontal conductor 190-1 by way of a programmable interconnect array (PIA) 132. The local vertical conductors 134 are also programmably coupled to the local horizontal conductors 136 by way of a programmable interconnect region 133. The local horizontal conductors 136 in turn couple to the EAB 104-1.

In order to fit a desired logic function, various logic elements and/or memory blocks are individually configured to perform a small but crucial part of the overall logic and/or memory function. Any automatic place and route software must then logically connect all the programmed logic elements and/or memory elements such that CPLD 100 may execute the desired logic function and or memory-logic function.

FIG. 2 illustrates a detailed view of the representative portion 110 of core region 120. The programmable interconnect region 133 includes a group of programmable connectors 150 associated with the local horizontal conductors 136. The group of programmable connectors 150 can selectively connect the local horizontal conductors 136 to the local vertical conductors 134. The programmable interconnect array 132 includes a group of programmable connectors 142. The group of programmable connectors 142 can selectively connect the local vertical conductors 134 to a plurality of row channels 194 included in the global horizontal conductor 190-1.

In order to fit a logic and/or a logic-memory function any place and route software can program selected ones of the programmable connectors 142 and programmable connectors 150 to connect the EAB 104-1 to certain of the row channels 194 using, for example, the local horizontal conductors 136 and the local vertical conductors 134. The local horizontal conductors 136 connect to EAB I/O lines 105 of the EAB 104-1. The EAB I/O line 105-1 is connected to a selected local horizontal row conductor 136-1 having an associated group of programmable connectors 140-1. The place and route software can then direct a programmable connector 150-1 included in the group of connectors 140-1 to connect the local horizontal conductor 136-1 to the local vertical conductor 134-1. The local vertical conductor 134-1 has an associated group of programmable connectors 144-1. The place and route software can further direct another selected programmable connector 142-1 included in the group of programmable connectors 144-1 to connect the local vertical conductor 134-1 to the row channel 194-1. In this manner, the EAB 104-1 can communicate with row channel 194-1 included in the global horizontal conductor 190-1 as well as with any circuitry connected thereto.

Each of the programmable connectors 150 and each of the programmable connectors 142 are controlled by individual switching devices 131. The individual switching devices 131 are switched between a connect state or a no-connect state by memory cells 135 included in the CPLD 100. As shown in FIG. 2A, for example, the representative programmable connector 150-1 is shown connected to an associated memory cell 135 by way of a memory cell node 131. The memory cell 135 must be capable of setting the programmable connector 150-1 to a connect state or a no-connect state depending on whether the associated local horizontal conductor 136-1 is programmably connected to the local vertical conductor 134-1.

The large quantity of memory cells 135 necessary to assure a high probability of fitting a complex function consumes large amounts of valuable die area and thus reduces the number of logic and memory elements that may be included in the CPLD 100. Therefore, increasing the quantity of memory cells 135 to improve the fitting probability for complex logic functions actually results in reducing the probability of fitting a desired complex logic due to the commensurate reduction in the number of available logic and memory elements in the CPLD 100.

In view of the foregoing, it is advantageous and therefore desirable to have available a programmable logic device which is capable of reducing those memory cells used to fit the desired logic function and/or memory function in a CPLD.

SUMMARY OF THE INVENTION

Broadly speaking, the invention relates to an integrated circuit that incorporates a memory efficient interconnection device. Typically, the integrated circuit chip is a complex programmable logic device architecture (CPLD). By using the memory efficient interconnection device, the invention is able to reduce the quantity of memory resources required to program the interconnection device while at the same time not substantially sacrificing the probability of fitting logic functions in the CPLD. The reduction in memory resources that the CPLD must provide leads to increased availability of precious die area for other components of the CPLD.

In a preferred embodiment of the invention, an integrated circuit includes a plurality of interconnect lines and a function block capable of operating in a plurality of modes. The function block also includes a plurality of function block Input/Output (I/O) lines. The integrated circuit further includes a memory efficient interconnection device for programmably interconnecting the interconnect lines to the function block I/O lines. The memory efficient interconnection device reduces its memory resources used to provide the programmable interconnections by sharing certain of the function block I/O lines of said function block.

In another aspect of the invention, a programmable logic device is disclosed. The programmable logic device includes an array of logic cells, each of which is capable of performing logic functions. The integrated circuit also includes a multiplicity of programmable connectors. Furthermore, the integrated circuit includes a plurality of programmable conductors each of which is associated with a plurality of the programmable connectors. A multiplicity of memory cells, each associated with an associated one of the programmable connectors, capable of setting its associated programmable connector to a desired state is also included in the programmable logic device.

The programmable logic device further includes at least one memory efficient interconnection device having a memory efficient interconnection device input coupled to at least one of the plurality of programmable conductors. The at least one memory efficient interconnection device also has a first memory efficient interconnection device output coupled to the array of logic cells. In the described embodiment, the memory efficient interconnection device automatically interconnects the programmable conductors to the array of logic cells. The memory efficient interconnection device has a second memory efficient interconnection device output coupled to a memory use signal generator which identifies those of the multiplicity of memory cells that are not being used to interconnect the programmable conductors to the array of logic cells.

Furthermore, the programmable logic device includes a mode control signal generator coupled to the memory efficient interconnection device. The mode control signal generator generates a mode signal used by the memory efficient interconnection device to interconnect the plurality of programmable conductors to the array of logic cells.

In still another aspect of the invention, a method of interconnecting functional units of a programmable logic device to assist in fitting a logic function in a programmable logic device is disclosed. The programmable device includes bidirectional ports, programmable connectors, and memory resources for controlling the programmable connectors. The inventive method includes the following operations. First, selected ones of the functional units are programmed to perform at least a subpart of the logic function to be fitted. Next, at least the selected functional units are interconnected by way of the programmable connectors as controlled by the memory resources such that unneeded ones of the programmable connectors are either not provided or do not consume memory resources.

In yet another aspect of the invention, a method of interconnecting functional units of a programmable logic device to assist in fitting a logic function in a programmable logic device is disclosed. In the described aspect, the programmable device includes bidirectional ports, a programmable interconnect array having a plurality of programmable connectors, and memory resources for controlling the programmable connectors. The inventive method includes the following operations. First, selected ones of the functional units are programmed to perform at least a subpart of the logic function to be fitted. Next, interconnections needed for the programmable interconnect array to connect to at least one of the functional units are determined. Those of the programmable connectors of the programmable interconnect array that are needed for making the determined interconnections are then determined.

Next, certain of the memory resources are allocated to those of the identified programmable connectors of the programmable interconnect array that are needed for making the determined interconnections. In addition, certain of the memory resources are not allocated to those of the programmable connectors other than the identified programmable connectors of the programmable interconnect array that are needed for making the determined interconnections.

Finally, the identified programmable connectors of the programmable interconnect array are programmed in accordance with the allocated memory resources to form the determined interconnections.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

DETAILED DESCRIPTION OF THE INVENTION

The invention relates to an integrated circuit that incorporates a memory efficient interconnection device. Typically, the integrated circuit chip is a complex programmable logic device architecture (CPLD). By using the memory efficient interconnection device, the invention is able to reduce the quantity of memory resources required to program the interconnection device while at the same time not substantially sacrificing the probability of fitting logic functions in the CPLD. The reduction in memory resources that the CPLD must provide leads to availability of precious die area for other components of the CPLD.

In the following description, numerous specific details are set forth in order to provide a thorough understanding of the present invention. It will be apparent, however, to one skilled in the art that the present invention may be practiced without some or all of these specific details. In other instances, well known structures or operations have not been described in detail in order to not unnecessarily obscure the present invention.

Figure 1:
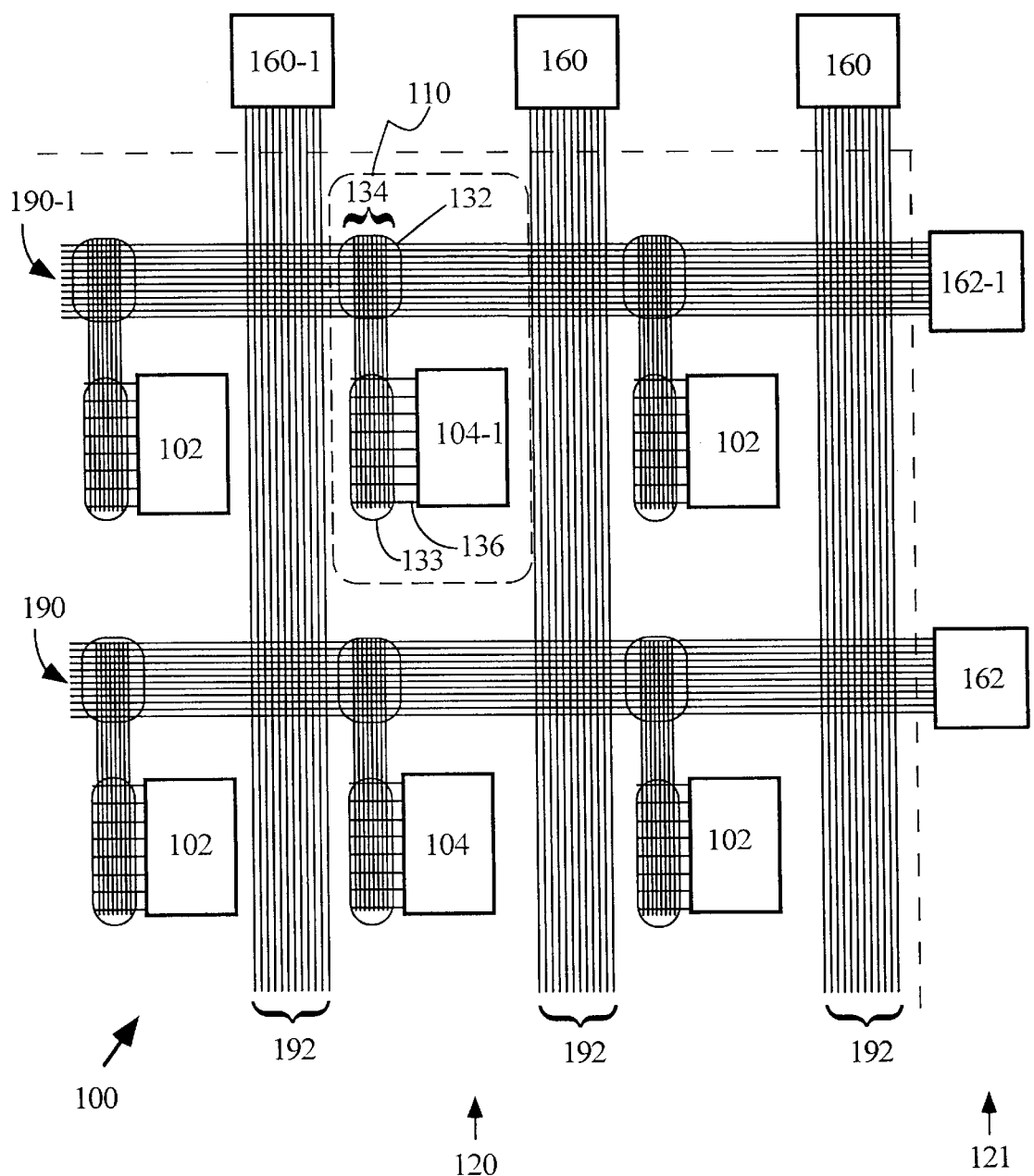
FIG. 1 is a block diagram of a conventional embedded array type complex programmable logic device architecture.
Figure 2:
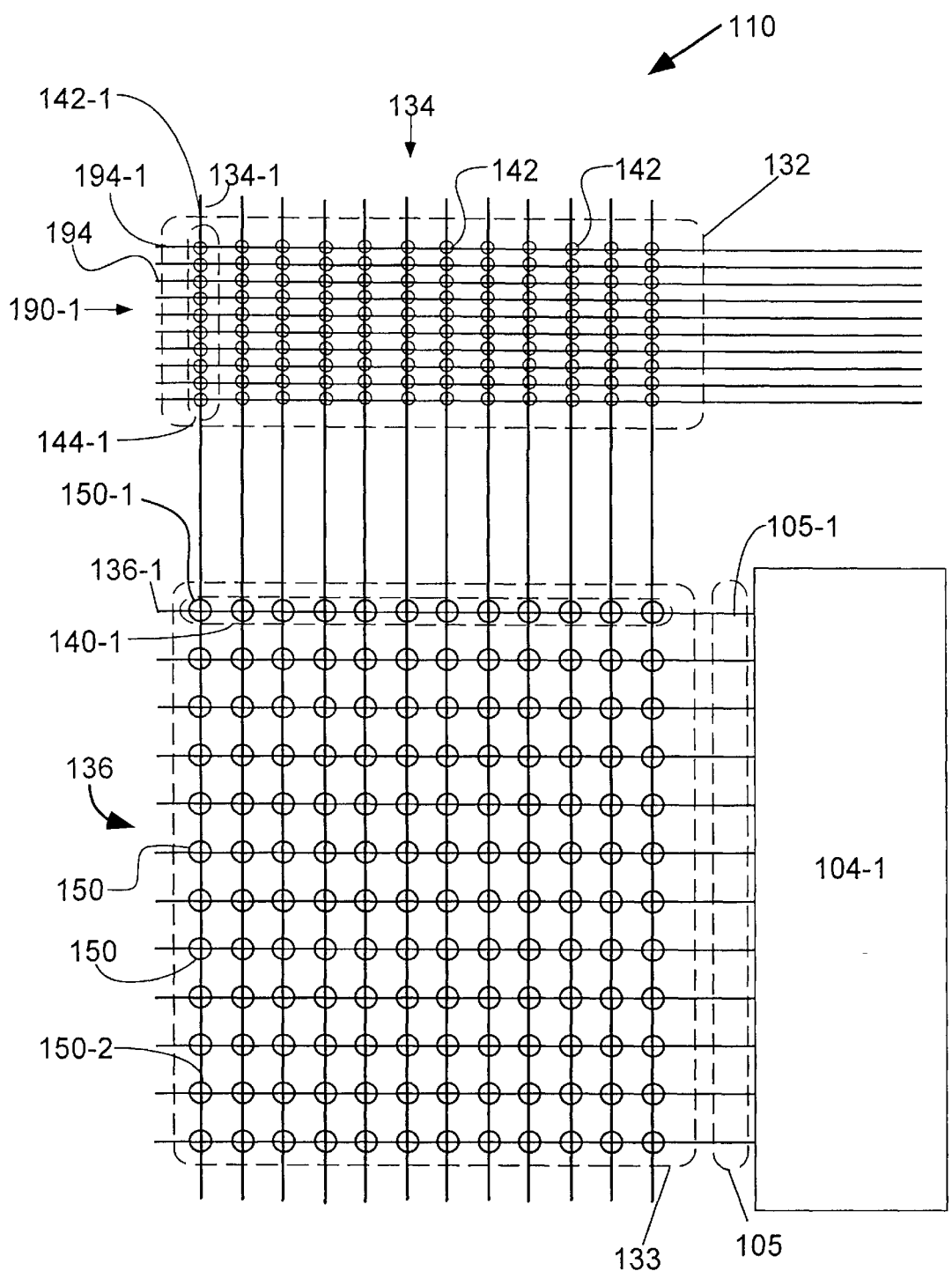
FIG. 2 is a schematic representation of a representative section of the conventional embedded array type complex logic device architecture as shown in FIG. 1.
Figure 2A:
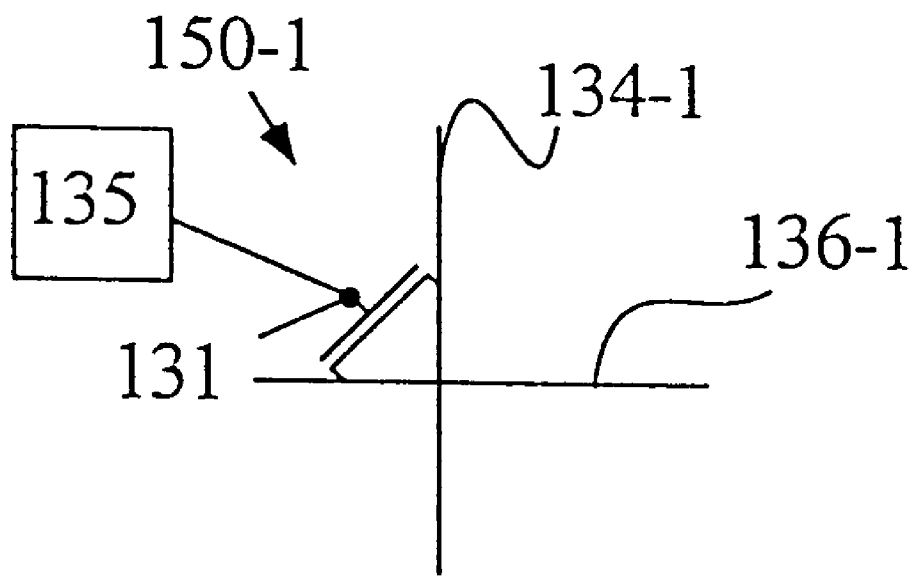
FIG. 2A is a schematic representation of a conventional programmable connector and its fixedly associated memory cell.
Figure 3A:
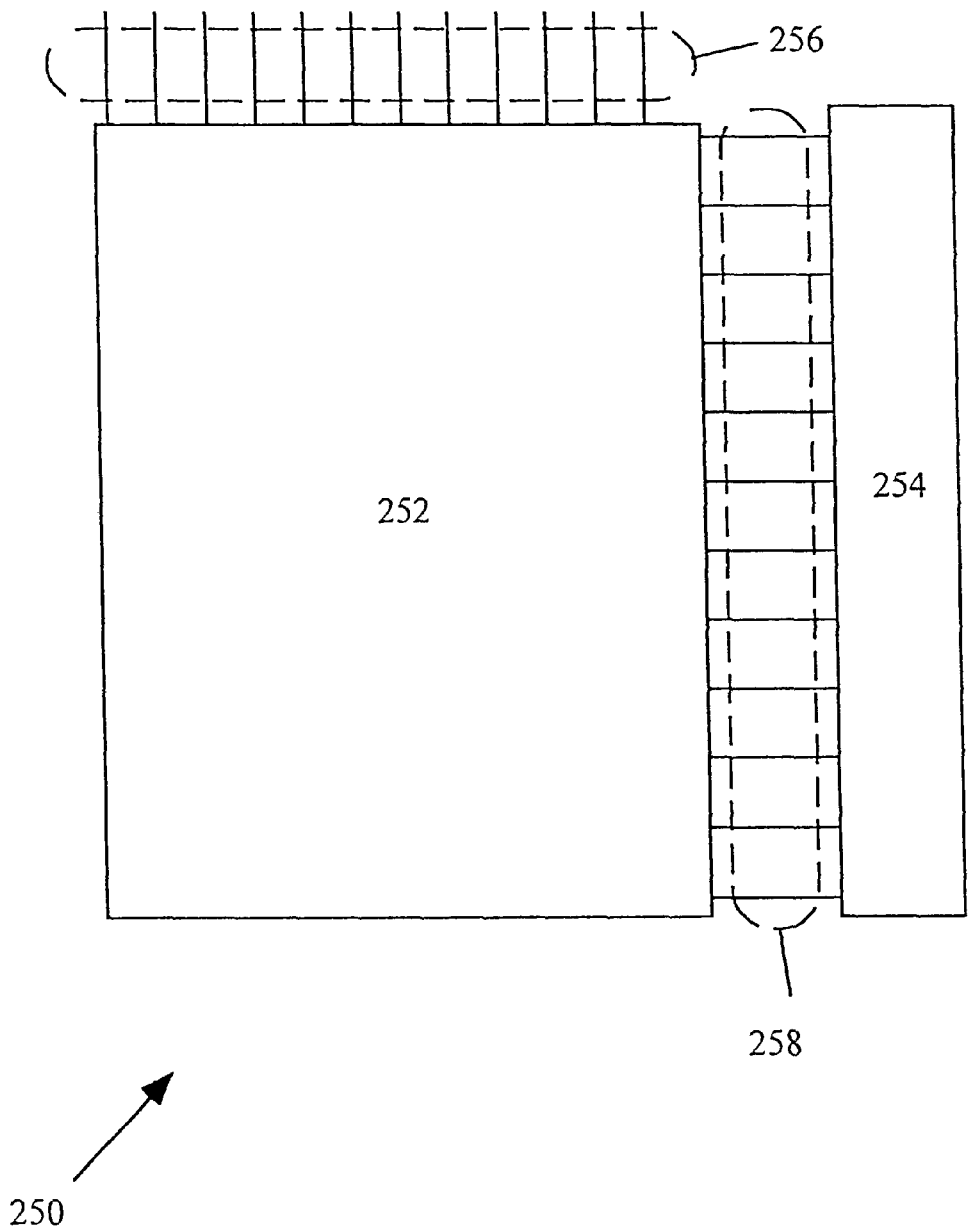
FIG. 3A is a block diagram of a memory efficient interconnection device in accordance with an embodiment of the invention.

FIG. 3A is a block diagram of an interconnection and functional block circuit 250 in accordance with a basic embodiment of the invention. The interconnection and functional block circuit 250 includes a memory efficient interconnection device 252 and a functional unit 254. The memory efficient interconnection device 252 receives a group of memory efficient interconnection device I/O lines 256. The functional unit 254 has a group of functional unit I/O lines 258 which couple to the memory efficient interconnection device 252. The memory efficient interconnection device 252 includes programmable connectors that are programmed by programming resources and operate to selectively connect the memory efficient interconnection device I/O lines 256 to the functional unit I/O lines. The memory efficient nature of the memory efficient interconnection device 252 is designed so that the memory resources needed to program interconnections formed by the programmable connectors within the memory efficient interconnection device 252 are reduced as compared to that conventionally required. In one embodiment, the memory resources are reduced by sharing certain of the programmable connectors that are associated with mutually exclusive ones of the functional unit I/O lines. In another embodiment, the memory resources are reduced by a dynamically allocation process in which only those of the programmable connectors needed (to supply signals to the functional unit I/O lines) are allocated memory resources.

Although not required, the functional unit 254 can be configured in many operational modes as deemed suited for a desired application. By way of example, the functional unit 254 can be a logic array block (LAB) or an embedded array block (EAB) which operates in more than one operational mode.

Figure 3B:
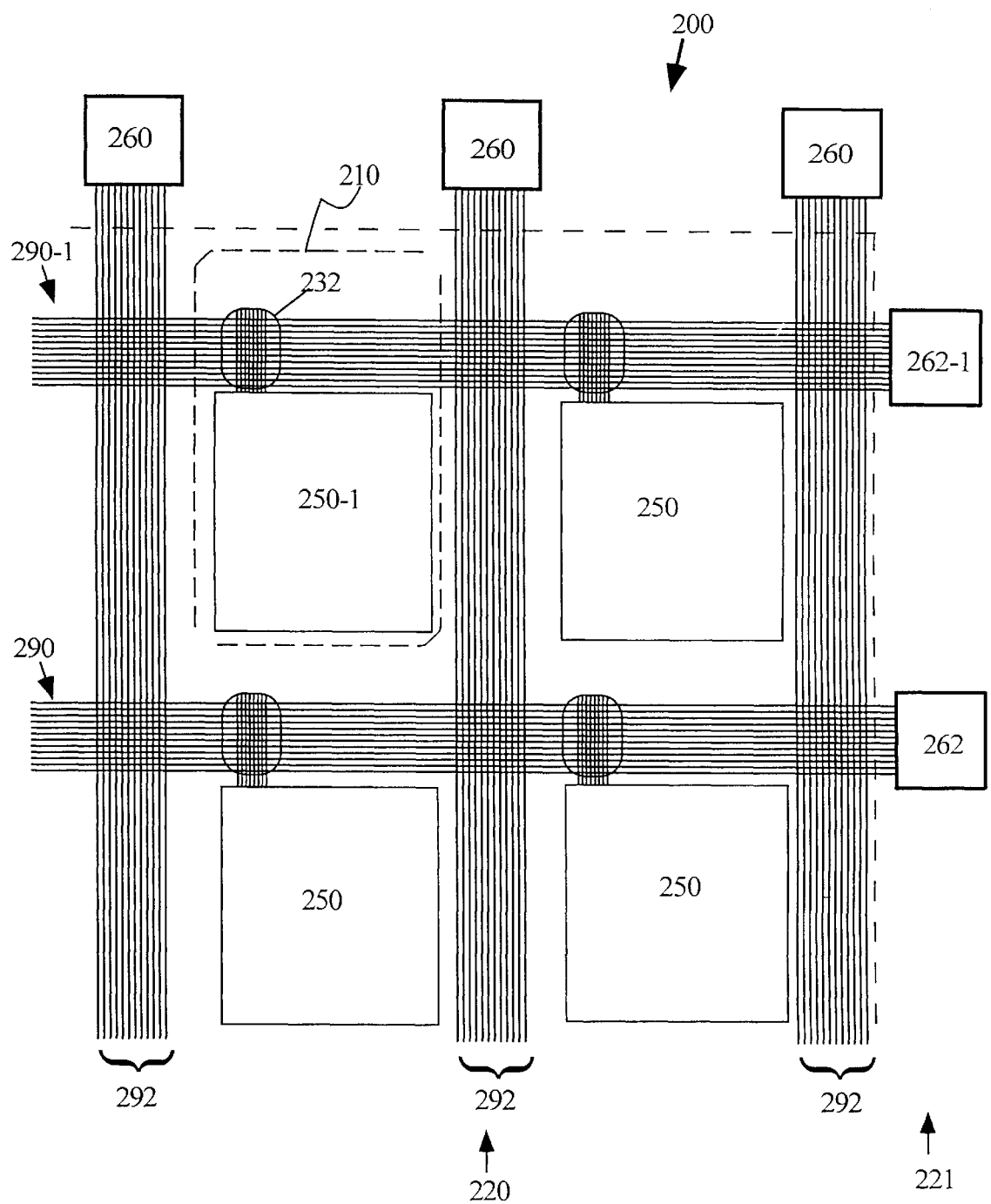
FIG. 3B is a block diagram of a complex programmable logic device architecture incorporating a functional block as shown in FIG. 3A.

The interconnection and functional block circuit 250 is normally formed in an integrated circuit. In the detailed embodiment of the invention discussed below, a plurality of the interconnection and functional block circuits 250 are formed in a CPLD. FIG. 3B is a block diagram of a CPLD 200 that includes the plurality of the interconnection and functional block circuits 250. Although only a few of the interconnection blocks 250 are illustrated in FIG. 3B, it should be appreciated that any number may be provided in order to meet the needs of a particular system.

The CPLD 200 includes a core region 220 coupled to a plurality of vertical bi-directional ports 260 and a plurality of horizontal bidirectional ports 262 included within a peripheral region 221. The core region 220 includes the interconnection and functional block circuits 250. The interconnection and functional block circuits 250 are programmably connected to a plurality of global horizontal conductors 290 and a plurality of global vertical conductors 292 to implement logical circuits within the CPLD. In a preferred embodiment, the interconnection and functional block circuit 250-1 is connected to a global horizontal conductor 290-1 by way of an associated programmable interconnect array 232. In this way, the interconnection and functional block circuit 250-1 can communicate with any others of the interconnection and functional block circuits 250 included in the CPLD 200. The interconnection and functional block circuit 250-1 can also communicate with any external circuitry by way of the horizontal bi-directional ports 262 or the vertical bi-directional ports. For example, the interconnection and functional block circuit 250-1 can connect to the horizontal bidirectional port 262-1 via the global horizontal conductor 290-1.

Figure 4:
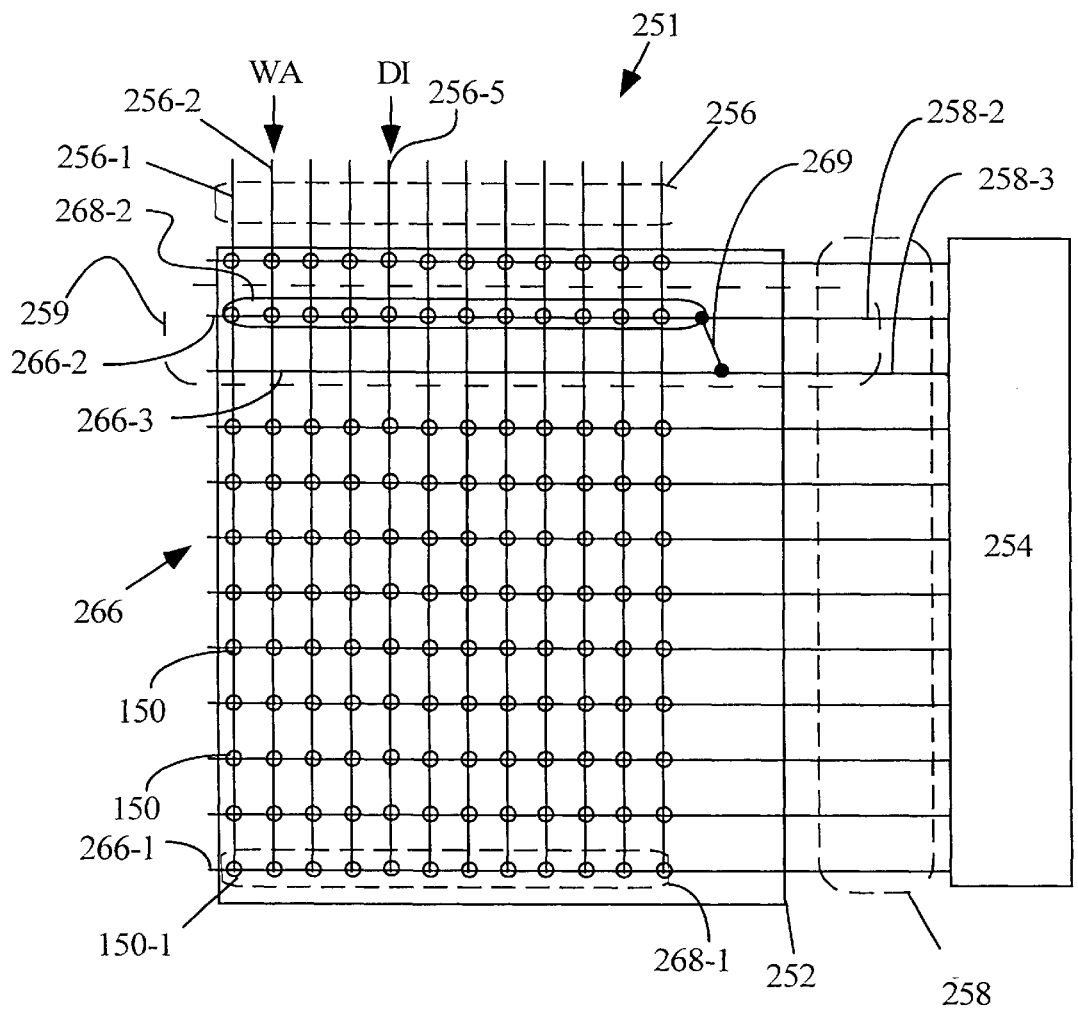
FIG. 4 is a schematic representation of a memory interconnection device using shared I/O pair lines to reduce the physical number of memory cells to fit a function unit in one embodiment of the invention.

FIG. 4 is a schematic diagram of an interconnect and functional block circuit 251 according to a first embodiment of the invention. The interconnect and functional block circuit 251 is a particular embodiment of the interconnect and functional block circuit 250. In this embodiment, the memory efficient interconnection device 252 includes a group of horizontal conductors 266 programmably connected by way of programmable connectors 150 to the memory efficient interconnection device I/O lines 256. Each horizontal conductor 266 in turn is connected to the function unit I/O lines 258. Each of the horizontal conductors 266 has an associated group of the programmable connectors 150. By way of example, the programmable connector 150-1 included in a group of programmable connectors 268-1 can be used to connect the horizontal conductor 266-1 to the memory efficient interconnection device I/O line 256-1.

In the first embodiment, the memory efficient interconnection device 252 utilizes a reduced number of memory cells (e.g., memory cells 135) to connect the functional unit 254 to the memory efficient interconnection device I/O lines 256 by not fully populating the memory efficient interconnection device 252 with programmable connectors 150. As compared to conventional multi-conductor switching devices, the memory efficient interconnection device 252 thus is able to use less memory resources because less programmable connectors are provided.

In one case, certain ones of the horizontal conductors 266 are associated with mutually exclusive signals that are supplied to or received from the functional unit 254. Mutually exclusive signals refer to those signals that can be temporally independent of each other. Often, the signals that are supplied to or received from the functional unit 254 tend to be partially mutually exclusive when the functional unit 254 has different operating modes. For example, when the functional unit 254 is or operates as a single port Random Access Memory (RAM) device, data represented by a DATA-IN signal is stored at a location represented by an WRITE ADDRESS signal during a RAM WRITE operation. However, the DATA-IN signal and the WRITE ADDRESS signal are temporally independent since the WRITE ADDRESS signal must precede the associated DATA-IN signal. Therefore, the WRITE ADDRESS signal and the associated DATA-IN signal are mutually exclusive in such a case. Since mutually exclusive signals are temporally independent, a single conductor (e.g., horizontal conductor 266) can be used to carry both signals. Accordingly, mutually exclusive signals can share a single conductor and thus use less memory resources.

Continuing with the above example, at least two of the horizontal conductors 266 associated with mutually exclusive signals can be combined to form a shared I/O line. Namely, as illustrated in FIG. 4, horizontal conductors 266-2 and 266-3 are shared such that the shared I/O line 259 is commonly supplied to the function unit I/O lines 258-2 and 258-3. Consequently, the programmable connectors 150 associated with the horizontal conductor 266-3 are physically not provided in the memory efficient interconnection device 252. By way of example, the shared I/O line 259 can be formed by using a coupler device 269 designed to electrically couple the horizontal conductor 266-2 to the horizontal conductor 266-3.

In this example, the functional unit 254 is configured to operate as the single port RAM device described above. According to the first embodiment, the memory efficient interconnection device 252 is capable of forming the shared I/O line pair 259 by using the coupler device 269. The coupler device 269 electrically connects the horizontal conductor 266-2 associated with the function unit I/O line 258-2 which carries the WRITE ADDRESS signal to the functional unit 254 to the horizontal conductor 266-3 associated with the function unit I/O line 258-3 which carries the DATA-IN signal 258-3 to the functional unit 254.

Further, the WRITE ADDRESS (WA) signal and the DATA-IN (DI) signal can by received from the global horizontal connector 290-1 over the memory efficient interconnection device I/O lines 256-2 and 256-5, respectively. The memory efficient interconnection device I/O lines 256-2 and 256-5 can then supply the WRITE ADDRESS (WA) and the DATA-IN (DI) to the functional unit 254 over the horizontal conductor 266-2 of the shared I/O pair line 259 by appropriate use of selected ones of the associated group of programmable connectors 268-2 associated with the horizontal conductor 266-2. As a result, the shared I/O line pair 259 supply both the WRITE ADDRESS (WA) signal and the DATA-IN (DI) signal to both the function unit I/O lines 258-2 and 258-3. The effect of the memory efficient nature of the memory efficient interconnection device 252 is that the horizontal conductor 266-3 does not include any of the programmable connectors 150 or any memory cells 135 therefor, yet all the needed signals are supplied to the functional unit 254.

Figure 5:
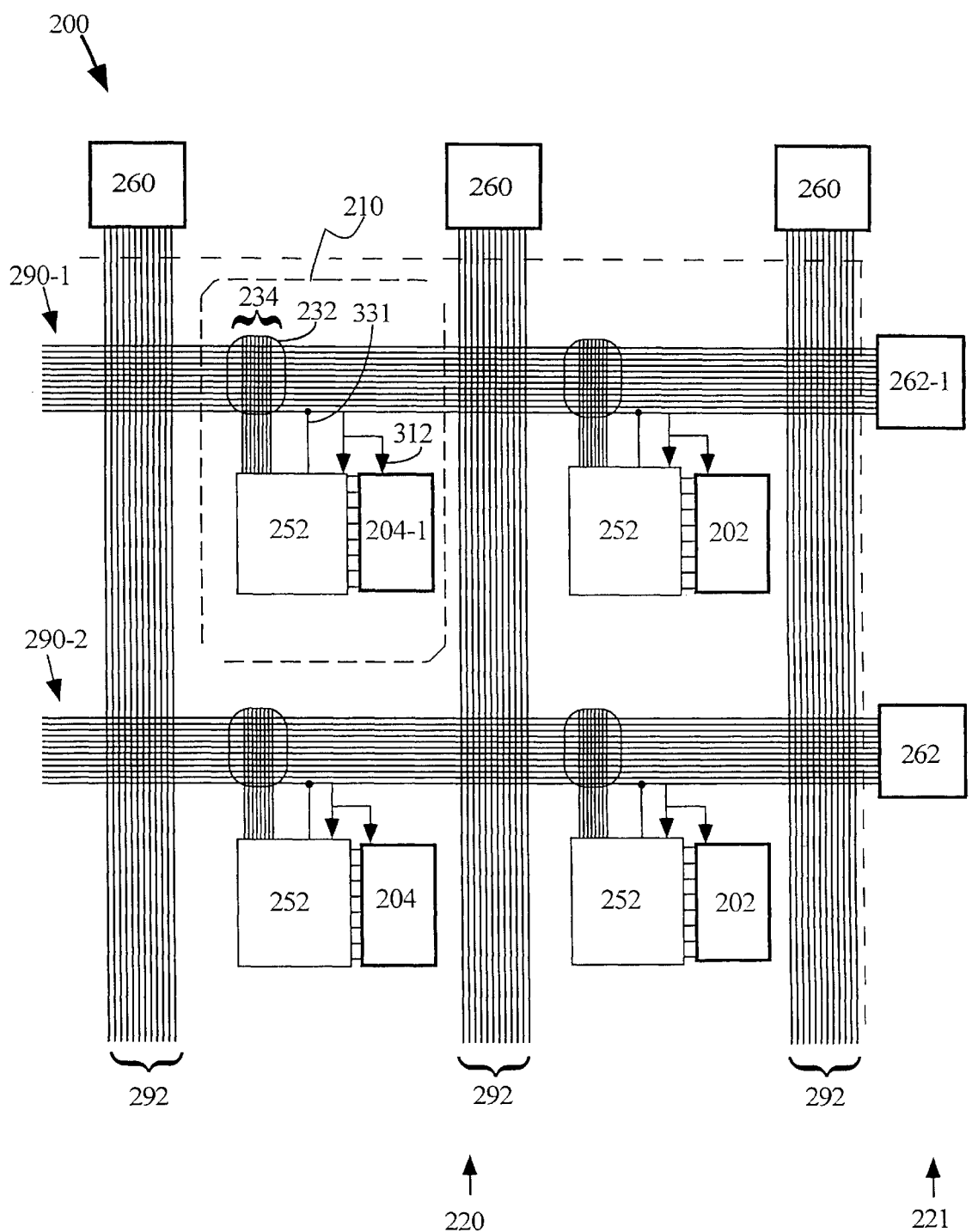
FIG. 5 is a schematic representation of a representative section of an embedded array type complex programmable logic device architecture incorporating a memory efficient interconnection device in a preferred embodiment of the invention.

The coupler device 269 can be formed in a number of ways, either in the memory efficient interconnection device or in the functional unit 254. For example, the coupler device 269 can be formed from a wire, a fusible line, a multiplexer, etc. Also, the functional unit 254 can be a variety of functional devices such as the logic array block (LAB) 202 and the embedded array block (EAB) 204 described above. FIG. 5 illustrates the CPLD 200 as including the LABs 202 and the EABs 204 in the core region 220 in place of the more general functional unit 254 illustrated in FIG. 3B.

Additional details of the CPLD 200 are explained with reference to a representative portion 210 of the core region 120 illustrated in FIG. 5. The representative portion 210 has the global horizontal conductor 290-1 coupled to the memory efficient interconnection device 252 by way of local vertical conductors 234. The memory efficient interconnection device 252 in turn is coupled to the EAB 204-1. The local vertical conductors 234 are programmably coupled to the global horizontal conductor 290-1 by way of a programmable interconnect array (PIA) 232. A mode control signal connector 312 provides a mode control signal to the EAB 204-1 and the memory efficient interconnection device 252. As an example, the mode control signal can be supplied via the global horizontal conductor 290-1. A memory use signal connector 331 capable of carrying a memory use signal can also be provided to the memory efficient interconnection device 252 via the global horizontal conductor 290-1.

The horizontal bidirectional port 262-1 can be selectively coupled to a global horizontal conductor 290-1 (and all row channels included therein) so that core region 220 may communicate with external circuitry connected to the horizontal bidirectional port 262-1. Such external circuitry may, for example, include systems such as Pentium™ based PCs or Sun SPARCstations™. Such systems being capable of executing automatic place and route software such as, for example, MAX+PLUS II™ developed by the Altera Corporation of San Jose, Calif. In a procedure known in the art as fitting a logic function, such automatic place and route software is used to logically couple previously programmed logic and memory units (e.g., functional units 254) included within core region 220 by programming various programmable connectors. In this manner, CPLD 200 is programmed to perform the logic function as desired.

Figure 6:
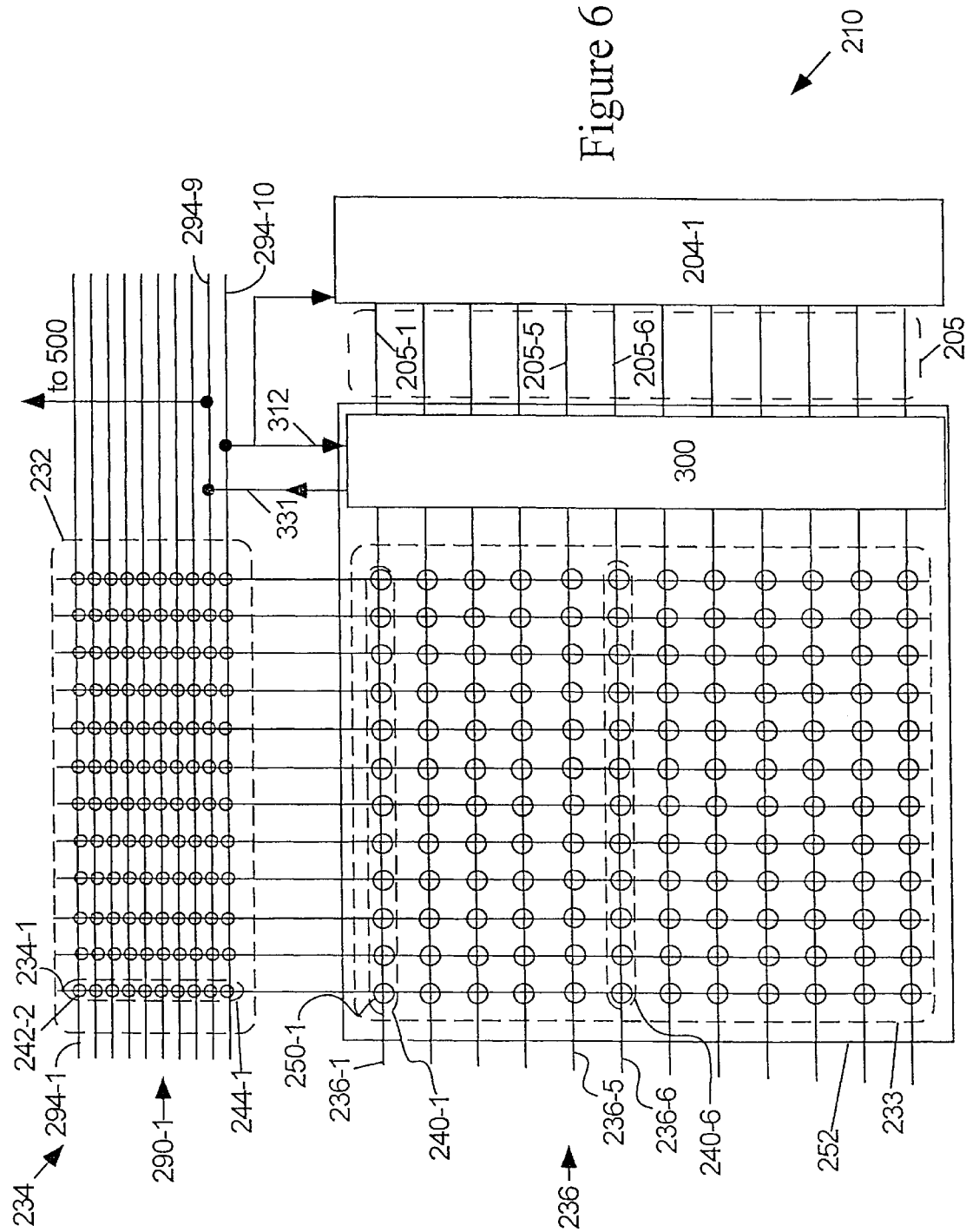
FIG. 6 is a circuit diagram of a representative portion of the embedded array type complex programmable logic device as shown in FIG. 5.

FIG. 6 illustrates a detailed view of the representative portion 210 of core region 220 of the CPLD 200 illustrated in FIG. 5 according to a second embodiment of the invention. In this embodiment, the representative section 210 includes the EAB 204-1 coupled to the horizontal conductor 290-1 by way of the memory efficient interconnection device 252. According to the second embodiment, the memory efficient interconnection device 252 utilizes a reduced number of memory cells (e.g., memory cells 135) to connect the fictional unit 254 to the local vertical conductors 234 by dynamically allocating the memory cells to those of the programmable connectors within the memory efficient interconnection device 252.

In this embodiment, the memory efficient interconnection device 252 includes a multiplexer 300 capable of connecting local horizontal lines 236 to EAB I/O lines 205 coupled to the EAB 204-1. The memory efficient interconnection device 252 further includes a programmable interconnect region 233 having programmable connectors 250. The programmable interconnect region 233 includes a group of programmable connectors 240 associated with each of the local horizontal conductors 236. The groups of programmable connectors 240 can selectively connect the local horizontal conductors 236 to the local vertical conductors 234.

Also, the programmable interconnect array 232 of the representative section 210 includes programmable connectors 242. The programmable connectors 242 are arranged in a manner so as to form a group of programmable connectors 244 associated with each of the local vertical conductors 234. The groups of programmable connectors 242 can selectively connect the local vertical conductors 234 to row channels 294 included in the global horizontal conductor 290-1.

In this second embodiment, the programmable connectors 250 are dynamically coupled to associated memory cells 135 within the CPLD 200. The memory cells 135 can be located in a central location or distributed within the CPLD 200. By dynamically coupled it is meant that each of the memory cells 135 can be freely associated with any of a plurality of the of programmable connectors 250 included in the CPLD 200.

In order to fit a logic and/or a logic-memory function place and route software can require selected programmable connectors 250 to connect the EAB 204-1 to the row channels 294 using, for example, the local horizontal conductors 236 and the local vertical conductors 234. More particularly, as an example, the memory efficient multiplexer 300 can be directed to couple an EAB I/O line 205-1 to a selected local horizontal row conductor 236-1 having an associated group of programmable connectors 240-1. The place and route software can then direct a programmable connector 250-1 included in the group of connectors 240-1 to connect the local horizontal conductor 236-1 to a local vertical conductor 234-1 having an associated group of programmable connectors 244-1. The place and route software can further direct another programmable connector 242-2 included in the group of programmable connectors 244-1 to connect the local vertical conductor 234-1 to a row channel 294-1. In this manner, the EAB 204-1 can communicate with the row channel 294-1 included in the global horizontal conductor 290-1 as well as with any other circuitry (e.g., external circuitry) connected to the global horizontal conductor 290-1 as described above.

The mode control signal can be supplied to the EAB 204-1 and the multiplexer 300 by way of the mode control signal connector 312. The mode control signal can be generated by any suitable circuit coupled to the memory control signal connector 312 by way of, for example, a row channel 294-10 included in the local horizontal conductor 290-1. The mode control signal can be used to configure the EAB 204-1 such that it can operate in an associated operating mode. The mode control signal can also be used by the multiplexer 300 to derive a connection pattern associated with the EAB operating mode 320. The multiplexer 300 can use the connection pattern to appropriately couple selected ones of the local horizontal conductors 236 to associated ones of the EAB I/O lines 205. The connection pattern can also be used to identify certain ones of the local horizontal conductors 236 and their associated programmable connectors 250 that are determined to be unused to connect the EAB 204-1 to the global horizontal conductor 290-1 during the fitting process. The advantage here is that those of the programmable connectors 250 that are unused after routing through the memory efficient interconnect 252 has been determined, need not be allocated memory resources (i.e., memory cells) to control the associated programmable connectors 250.

In one case, the multiplexer 300 can generate a memory cell use signal associated with the EAB operating mode using the mode control signal. The memory cell use signal can be passed to a memory cell identifier unit 500 by way of a memory cell use signal connector 331, connected to a row channel 294-9 for example. The memory cell use signal can be used by the memory cell identifier unit 500 to identify those memory cells associated with the unused ones of the plurality of horizontal conductors 236.

By way of example, a logic function and/or a memory-logic function can be fitted using appropriate place and route software. The place and route software can require that various logic elements and/or memory blocks be individually configured to perform a small but crucial part of the logic function and/or the memory-logic function. For example, fitting the logic function and/or the memory-logic function can require the place and route software to form a mode control signal appropriate for the desired function to be fitted. The mode control signal can be carried by the mode control signal connector 312 to the EAB 204-1 and the multiplexer 300. The mode control signal can be used by appropriate circuitry to selectively arrange the EAB 204-1 to operate in an associated operating mode. By way of example, the mode control signal can be used by the appropriate circuitry to arrange the EAB 204-1 to operate as a single PORT Random Access Memory (RAM) device having a 204-8 (number of wordlines)×1 (number of outputs) architecture associated with a operation mode. In another arrangement, a mode control signal can be used by the appropriate circuitry to arrange the EAB 204-1 to operate as a single PORT Random Access Memory (RAM) device having a 128 (number of wordlines)×8 (number of outputs) architecture associated with another operation mode.

Using any number of techniques well known to those of ordinary skill in the art, the multiplexer 300 can use the mode control signal to derive a connection pattern associated with the EAB operating mode. One such technique utilizes a lookup table device capable of selecting the connection pattern associated with the EAB operation mode. The memory efficient multiplexer 300 can subsequently use the connection pattern, for example, to identify at least one of the local horizontal conductors 236 not used in routing the EAB 204-1 in the CPLD 200. As described above, mutually exclusive signals refer to those signals that can be temporally independent of each other. Hence, the connection pattern signal can take advantage of the mutually exclusive nature of such signals by directing the multiplexer 300 to form, for example, a shared I/O line pair.

By way of example, a mode control signal can direct the EAB 204-1 to operate in the single PORT RAM operation mode. In the described embodiment, the EAB I/O line 205-5 can act as a DATA-IN line capable of receiving a DATA signal representing data to be stored in the EAB 204-1 during an associated WRITE cycle. The DATA signal can be passed from the global horizontal conductor 290-1, for example, by way of the local horizontal conductor 236-5 during the associated WRITE cycle. The EAB I/O line 205-6 can act as a WRITE address line capable of receiving a WRITE address signal corresponding to a requested address location in the EAB 204-1.

In one embodiment, the WRITE address signal can be passed from the local horizontal conductor 290-1 by way of the local horizontal conductor 236-6 during an associated WRITE cycle. It should be noted that in the example, the EAB 204-1 is configured to operate as a single PORT RAM device and as such the WRITE address signal is temporally independent of the DATA signal and are thus mutually exclusive. The multiplexer 300 uses the connection pattern to arrange for only one of the local horizontal conductors 236 to carry both the WRITE address signal and the DATA signal from the global horizontal conductor 290-1 to the EAB 204-1, thus yielding an unused one of the local conductors 236. In this manner, the memory cell usage device 500 using the memory cell usage signal generated by the multiplexer 300 can identify a group of unused memory cells associated with the unused local horizontal conductor.

For example, the multiplexer 300 can use the connection pattern to arrange for the local horizontal conductor 236 -5 to carry both the WRITE address signal and the DATA signal. The multiplexer 300 subsequently identifies the local horizontal conductor 236-6 that is then unused. A memory cell usage signal generated by the multiplexer 300 is then sent to the memory cell identifier unit 500. The memory cell use identifier unit 500 identifies a group of unused memory cells associated with the group of programmable connectors 240-6 associated with the unused local horizontal conductor 236-6. Preferably, the group of unused memory cells can be associated with other programmable connectors included in the CPLD 200, thereby improving the ability of the CPLD 200 to successfully fit a complex logic and/or memory-logic function while using less memory resources.

Figure 7:
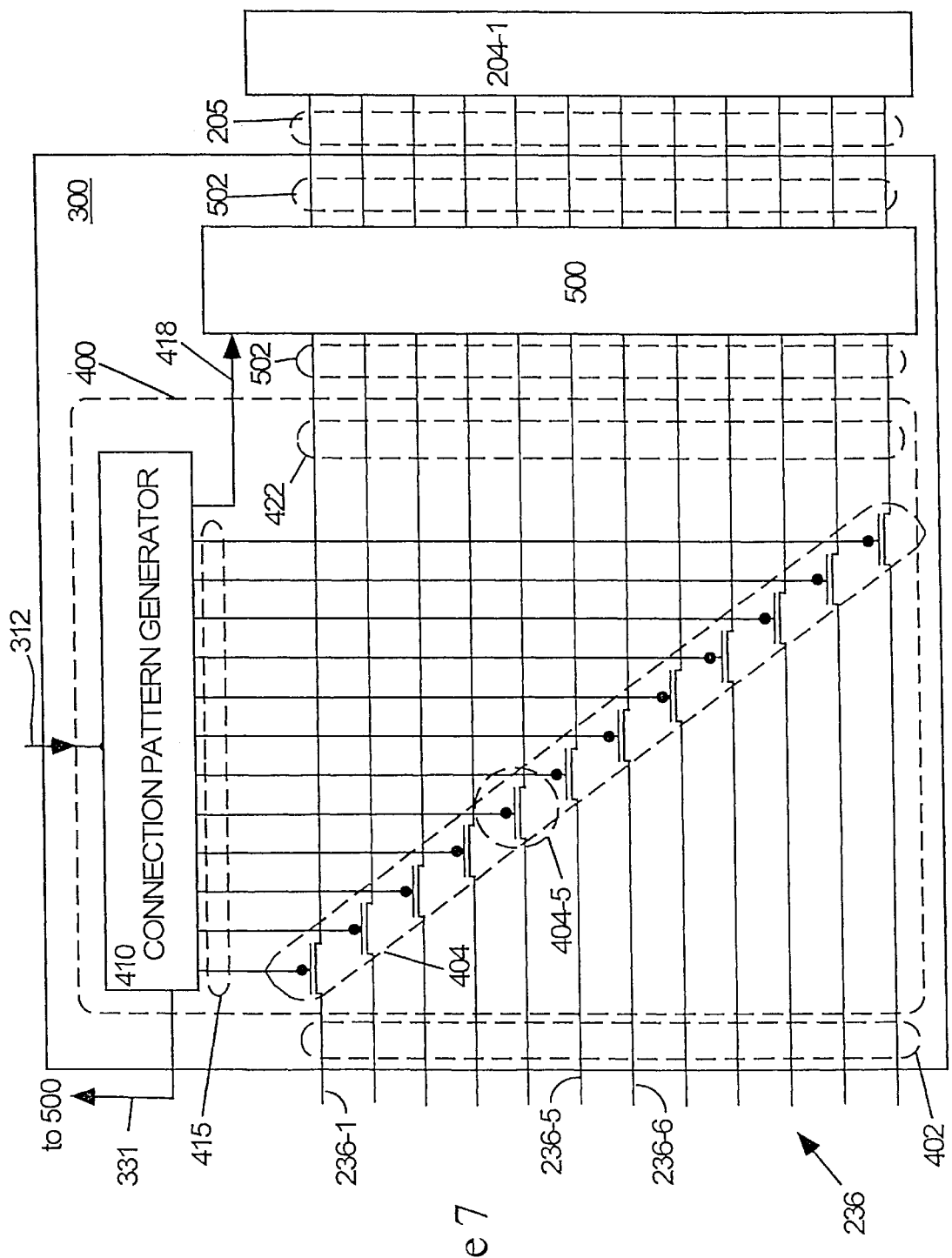
FIG. 7 is a circuit diagram of a first selector unit included in a memory efficient multiplexer included in a memory efficient interconnection device in a preferred embodiment of the invention.

The memory efficient multiplexer 300 will now be described in greater detail with reference to FIG. 7 and FIG. 8. Referring first to FIG. 7, the multiplexer 300 includes a first selector unit 400 connected to a second selector unit 500. The first selector unit 400 includes a first group of first selector I/O lines 402 connected to the local horizontal conductors 236. The first group of first selector I/O lines 402 are also programmably coupled to a second group of first selector I/O lines 422 by way of a group of programmable first selector switches 404. The first selector switches 404 are, for example, formed from transistors. The second group of first selector I/O lines 422 are coupled to a group of second selector I/O lines 502 associated with the second selector unit 500.

The first selector unit 400 also includes a connection pattern generator 410 suitably arranged to receive the mode control signal via the mode control signal connector 312. The connection pattern generator 410 further forwards the memory cell usage signal over the memory cell usage signal connector 331 to the memory cell usage identifier unit 500. The connection pattern generator 410 also supplies a connection pattern signal to the second selector unit 500 by way of a connection pattern signal connector 418. The connection pattern generator 410 still further produces a group of connection pattern generator outputs connected to the group of first selector switch units 404 by way of an associated group of first selector switch connectors 415.

Figure 8:
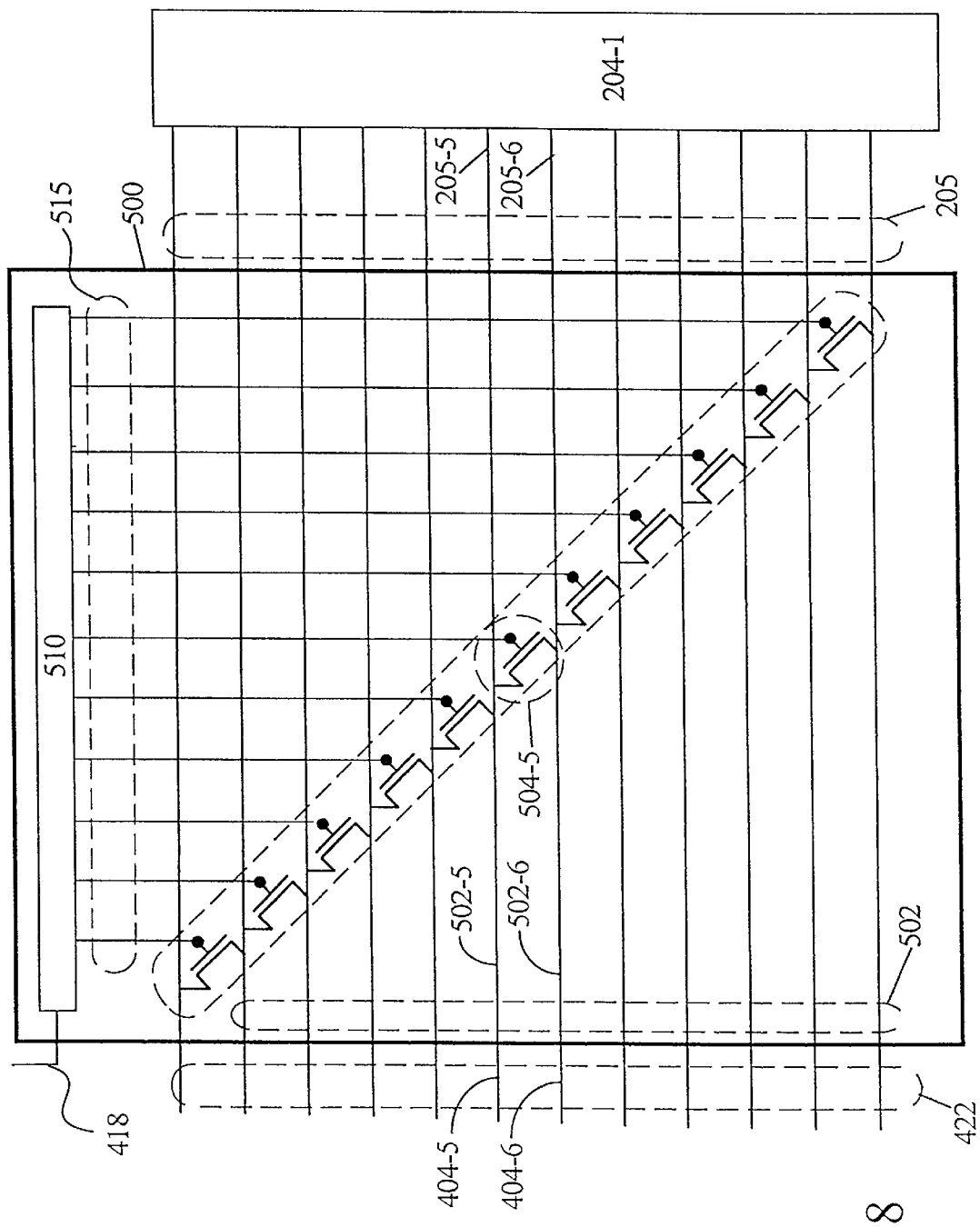
FIG. 8 is a circuit diagram of a second selector unit included in a memory efficient multiplexer in a preferred embodiment of the invention.

FIG. 8 is a schematic diagram of the second selector unit 500 according to an embodiment of the invention. The second selector unit 500 includes a connection pattern decoder unit 510 capable of forming a conductor coupling pattern in accordance with the connection pattern signal provided by the connection pattern signal connector 418. The second selector unit 500 also includes a group selector I/O lines 502 connected to the second group of first selector I/O lines 422. The group of second selector I/O lines 502 are also connected to the group of EAB I/O lines 205 by way of an associated group of second selector switches 504. The first selector switches 504 are, for example, formed from transistors. The connection pattern signal decoder unit 510 are connected to the group of second selector switches 504 by way of an associated group of second selector switch connectors 515. In this manner, for example, the connection pattern decoder unit 510 can operate to selectively connect the second selector I/O line 502-5 to the second selector I/O line 502-6 by supplying the conductor coupling pattern to the second selector switches 504, which activates the second selector switch 504-5.

Figure 9:
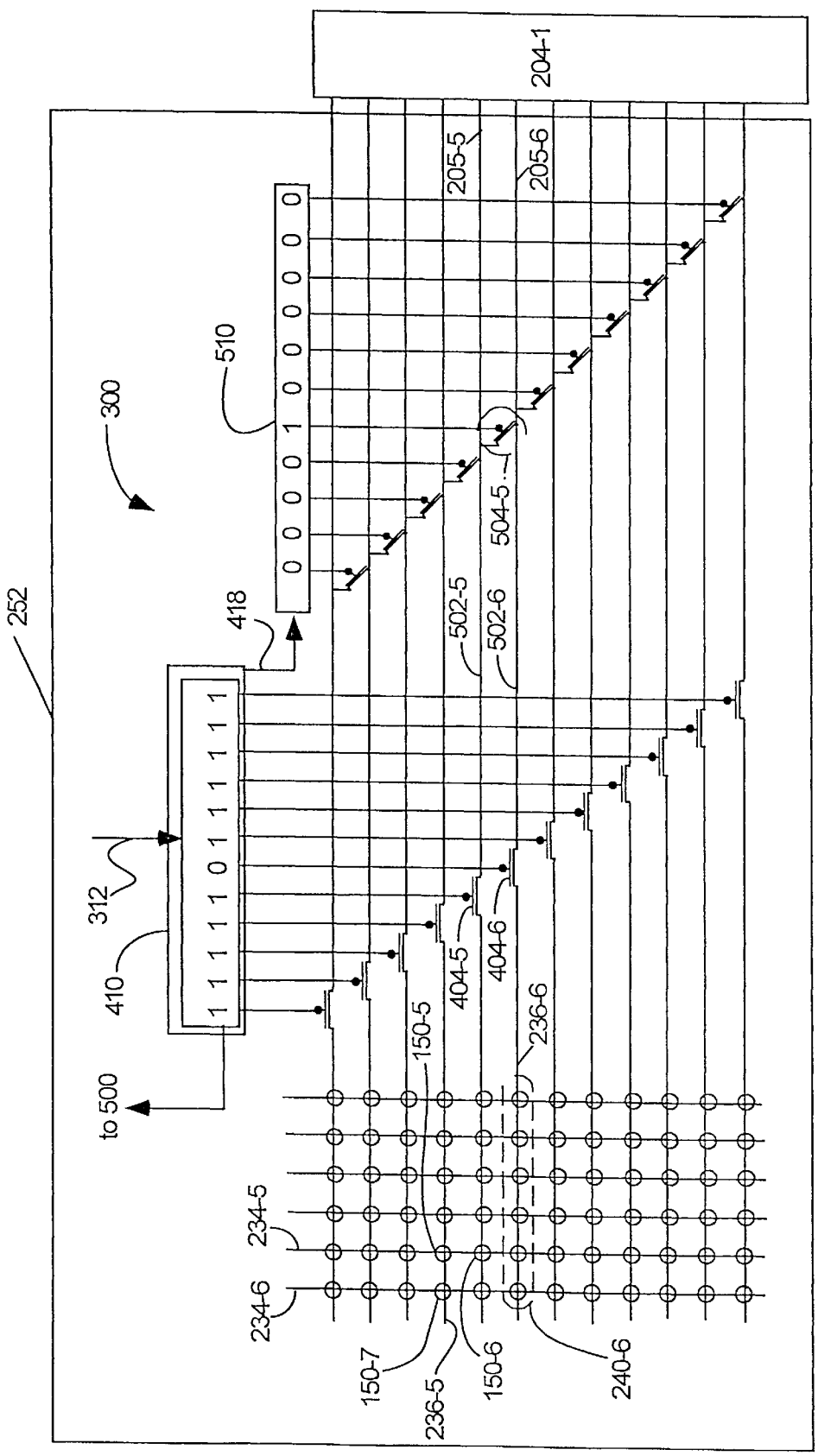
FIG. 9 is a circuit diagram of a memory efficient interconnection device fitting a function block configured to operate as an embedded array block in accordance with a preferred embodiment of the invention.

Referring now to FIG. 9 illustrating an example of how the memory efficient interconnection device 252 reduces the number of memory cells 135 used to route signals to and from the EAB 204-1. The memory interconnection device 252 uses the mutually exclusive nature of a DATA-IN signal and an associated WRITE address signal to identify those memory cells 135 not needed with rating to or from the EAB 204-1.

As discussed in the example above, the mode control signal received over the mode control signal connector 312 directs the EAB 204-1 to operate in the EAB operating mode consistent with a single PORT RAM device. As configured, the EAB I/O line 205-5 can receive the DATA-IN (DI) signal 209-1 only after the corresponding WRITE address (WA) signal is received at the EAB I/O line 205-6. In the described embodiment, a local vertical conductor 234-5 can be selected to carry the DATA-IN (DI) signal and a local vertical conductor 234-6 can be selected to carry the WRITE address (WA) signal.

Fortunately, the improved architecture of the CPLD 200 substantially eliminates the fitting problems caused by the inefficient use of programmable connectors in core region 220. By using the mode control signal to identify mutually exclusive signals, for example, the multiplexer 300 is capable of efficiently connecting the EAB 204-1 to the global horizontal conductor 290-1.

As shown in FIG. 9, the multiplexer 300 uses the mode control signal to derive a connection pattern using, for example, a lookup table-type device. In one embodiment, the connection pattern can take the form of a data word represented by a string of binary digits which may be passed to the group of first selector switches 404 by way of the associated group of first selector switch connectors 415. By way of example, the connection pattern as represented by a string of binary digits {1 1 1 1 1 0 1 1 1 1 1 1} will de-couple the local horizontal conductor 236-6 from the EAB I/O line 205-6 by causing the associated first selector switch 404-6 to "TURN OFF" and become substantially non-conducting. All other of the local horizontal conductors 236 will be coupled to the associated ones of the group of EAB I/O lines 205.

In a preferred embodiment, the connection pattern as represented by the string of binary digits {1 1 1 1 1 0 1 1 1 1 1 1} will be forwarded to the connection pattern decoder unit 510 included in the second selector unit 500 by way of the connector pattern signal connector 418. The connection pattern decoder unit 510 will then decode the received string of binary digits {1 1 1 1 1 0 1 1 1 1 1 1} to form a conductor coupling pattern in the form of, for example, a second string of binary digits {0 0 0 0 1 0 0 0 0 0 0}. The connection pattern decoder unit 510 then supplies the second string of binary digits {0 0 0 0 1 0 0 0 0 0 0} to the group of second selector switches 504. In this manner, the second selector I/O line 502-5 is coupled to the second selector I/O line 502-6 such that the local horizontal conductor 236-5 can drive both the EAB I/O line 205-5 and the EAB I/O line 205-6.

Place and route software can use the programmable connector 150-5 to couple the local vertical conductor 234-5 carrying the DATA-IN (DI) signal to the local horizontal conductor 236-5. Similarly, the place and route software can use a programmable connector 150-7 to couple the local vertical conductor 234-6 carrying the WRITE address (WA) signal to the local horizontal conductor 236-5. In this manner, the mutually exclusive DATA-IN signal and the WRITE address signal can be supplied to the EAB I/O line 205-5 and the EAB I/O line 205-6, respectively, without using the group of programmable connectors 240-6 associated with the unused local horizontal conductor 236-6. It should be noted that in this example, the EAB I/O line 205-5 is disabled during the portion of the WRITE cycle corresponding receiving the WRITE address signal. Also, the EAB I/O line 205-6 is disabled during the receiving of the DATA-IN signal.

Finally, the multiplexer 300 passes the first string of binary digits {1 1 1 1 1 0 1 1 1 1 1 1} to the memory usage identifier unit 500. The memory usage identifier unit 500 can identify those of the memory cells 145 included in the CPLD 200 associated with the unused local horizontal conductor 236-6.

Figure 10:
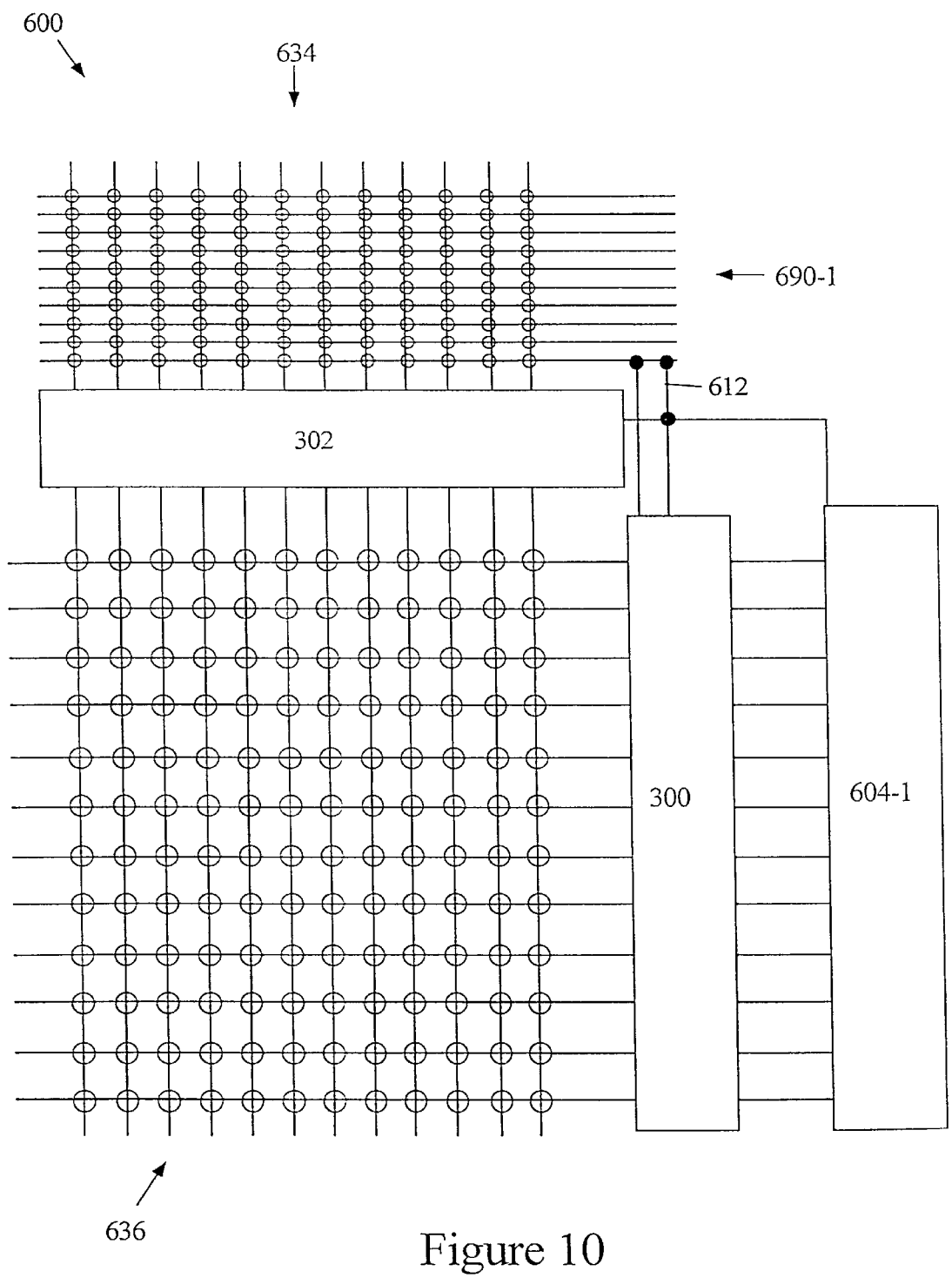
FIG. 10 is a schematic representation of an embedded array type complex programmable logic device architecture incorporating a plurality of memory efficient interconnection devices in accordance with another embodiment of the invention.

FIG. 10 represents a CPLD 600 architecture having a first multiplexer 300 and a second multiplexer 302. In the described embodiment, the first memory efficient multiplexer 300 can selectively connect an embedded array functional block 604-1 to certain ones of a plurality of local horizontal conductors 636. The second multiplexer 302 can connect selected ones of a plurality of local vertical conductors 634 to the certain ones of the local horizontal conductors 636. Selected ones of the local vertical conductors 634 can be programmably connected to selected row channels 694, for example, included in a global horizontal conductor 690-1. As directed by place and route software, for example, a mode control signal generated by any appropriate circuit can be supplied to the first memory efficient multiplexer 300 and the second memory efficient multiplexer 302 by way of a mode control signal connector 612. The first multiplexer 300 and the second multiplexer 302 can use the mode control signal to efficiently connect the EAB 604-1 to the global horizontal conductor 690-1.

Figure 11:
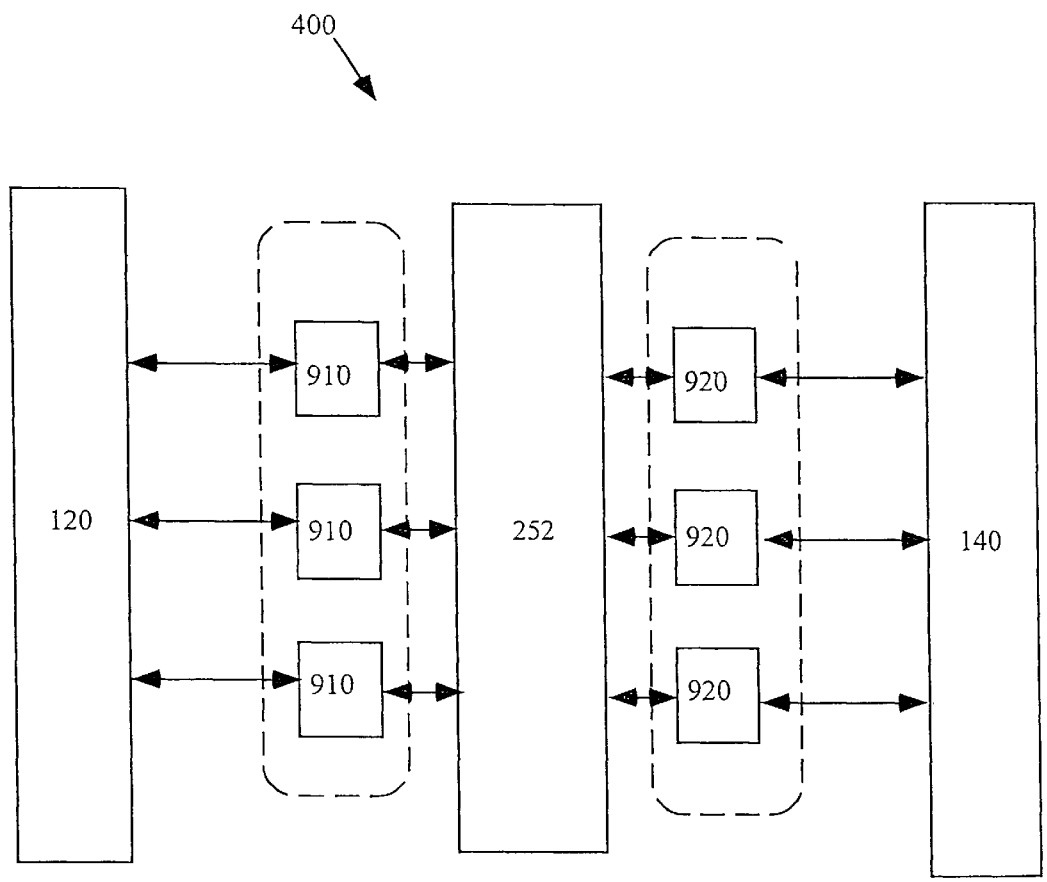
FIG. 11 is a schematic representation of complex programmable logic device architecture incorporating a memory efficient interconnection device used to interconnect a group of functional blocks in accordance with yet another embodiment of the invention.

FIG. 11 represents another CPLD architecture 400 which includes a PLD I/O block 120 bi-directionally coupled to interconnected functional blocks 910. A memory efficient interconnect device 252 suitably connects the interconnected functional blocks 910 to interconnected functional blocks 920. In the described embodiment, the interconnected functional blocks 920 can be coupled to a PLD I/O block 120. The PLD I/O block 120 and the PLD I/O block 140 can be connected to any suitable external circuitry.

Several advantages to using the memory efficient multiplexer stem from the increased routability due to the more efficient use of a limited number of memory cells. One advantage is that the memory cells identified to be unused can be associated with others of the programmable connectors included in the CPLD. Another advantage is that the risk of fitting a logic function with unacceptable performance problems caused by circuitous routing is substantially reduced. Consequently, the increased flexibility enables the CPLD to fit more complex logic functions more often than possible with conventional CPLD architectures.

Although the foregoing invention has been described in some detail for purposes of clarity of understanding, it will be apparent that certain changes and modifications may be practiced within the scope of the appended claims. It should be noted that there are many alternative ways of implementing the present invention. It is therefore intended that the following appended claims be interpreted as including all such alterations, permutations, and equivalents as fall within the spirit and scope of the present invention.

What is claimed is:

1. An integrated circuit, comprising:
   a plurality of interconnect lines;
   a function block capable of operating in a plurality of modes, said function block includes a plurality of function block Input/Output (I/O) lines; and
   an interconnection device configured to programmably interconnect said interconnect lines to the function block I/O lines, wherein said interconnection device reduces its memory resources used to provide the programmable interconnections by sharing certain of the function block I/O lines of said function block; and
   a memory use signal generator coupled to said interconnection device, said memory use signal generator generates a plurality of memory use signals, the memory use signals identify the unneeded memory resources in accordance with the mode of said function block.

2. An integrated circuit, comprising:

a programmable interconnection device arranged to automatically interconnect certain ones of a plurality of logic cells by way of selected ones of a plurality of programmable conductors wherein each of the selected ones of the programmable conductors is controlled by a particular one of a multiplicity of memory cells;

a memory use signal generator coupled to the programmable interconnection device arranged to identify those of the multiplicity of memory cells that are not being used to control the selected ones of the plurality of programmable conductors that are being used to interconnect the certain ones of the plurality of logic cells; and a mode control signal generator coupled to the programmable interconnection device, the mode control signal generator generates a mode signal used by the programmable interconnection device to interconnect the plurality of programmable conductors to the array of logic cells.

3. The integrated circuit as recited in claim 2 wherein, the programmable interconnection device further includes:

a first selector unit, the first selector unit having a first selector input line coupled to an associated first selector output line by way of a first selector switch unit, the first selector input line being coupled to an input line of the interconnection device, the first selector unit connects the selected ones of the plurality of programmable conductors to the associated first selector unit output line; and a second selector unit, the second selector unit having a second selector unit input line coupled to the associated first selector output line and a second selector unit output line coupled to an associated output line of the interconnection device, the second selector unit connects selected ones of the plurality of conductors to the second selector unit output line by way of a second selector unit switch device.

4. The integrated circuit as recited in claim 3 wherein, the first selector unit further includes the memory use signal generator coupled to the mode control signal generator, a memory cell usage identifier unit, the second selector unit, and the second selector unit switch device.

5. The integrated circuit as recited in claim 4, wherein the memory use signal generator generates a memory use signal derived from a received mode signal, the memory use signal identifies those of the multiplicity of memory cells that are not being used to interconnect the programmable conductors to the plurality of logic cells.

6. The integrated circuit as recited in claim 5, wherein the memory use signal is used by the first selector unit to connect the selected ones of the plurality of programmable conductors to the associated first selector unit output line.

7. The integrated circuit as recited in claim 5, wherein the memory use signal is used to generate a conductor coupling signal used by the second selector unit to programmably connect the selected ones of the plurality of conductors to a programmable interconnection device output.

8. The integrated circuit as recited in claim 6, wherein the first selector switch unit is an n channel passgate transistor having a source coupled to the first selector unit input line and a drain coupled the first selector unit output line and a gate coupled to a memory use signal generator output.

9. The integrated circuit as recited in claim 8 wherein the programmable interconnection device is one of a plurality of programmable interconnection devices.

10. The integrated circuit as recited in claim 9 further including:

an adaptable memory block coupled to the programmable of logic cells by way of at least one of the plurality of programmable interconnection devices and to the mode control signal generator, the adaptable memory block changes its operating form depending on which mode control signals are received by the adaptable memory block.

11. The integrated circuit as recited in claim 6, wherein the second selector switch unit is an n channel passgate transistor having a source coupled to the second selector unit input line and a drain coupled the second selector switch unit output line and a gate coupled to a memory use signal generator output.

12. The integrated circuit as recited in claim 2, wherein the integrated circuit is a programmable logic device.

13. The integrated circuit as recited in claim 2, wherein the memory cell is a static random access memory cell.

14. The integrated circuit as recited in claim 2, wherein the plurality of logic cells is selectively grouped into a set of logic blocks.

* * * * *